United States Patent
Ng

(10) Patent No.: US 10,109,592 B2
(45) Date of Patent: Oct. 23, 2018

(54) SEMICONDUCTOR CHIP WITH ELECTRICALLY CONDUCTING LAYER

(71) Applicant: Infineon Technologies AG, Neubiberg (DE)

(72) Inventor: Chee Yang Ng, Muar (MY)

(73) Assignee: Infineon Technologies AG, Neubiberg (DE)

( * ) Notice: Subject to any disclaimer, the term of this patent is extended or adjusted under 35 U.S.C. 154(b) by 400 days.

(21) Appl. No.: 14/089,971

(22) Filed: Nov. 26, 2013

(65) Prior Publication Data

US 2015/0145107 A1 May 28, 2015

(51) Int. Cl.
| | |
|---|---|
| *H01L 23/552* | (2006.01) |
| *H01L 23/66* | (2006.01) |
| *H01L 23/00* | (2006.01) |
| *H01L 23/31* | (2006.01) |
| *H01L 23/29* | (2006.01) |
| *H01L 23/495* | (2006.01) |
| *H01L 21/56* | (2006.01) |

(52) U.S. Cl.
CPC ............ *H01L 23/552* (2013.01); *H01L 23/66* (2013.01); *H01L 24/19* (2013.01); *H01L 24/20* (2013.01); *H01L 24/96* (2013.01); *H01L 24/97* (2013.01); *H01L 21/561* (2013.01); *H01L 21/568* (2013.01); *H01L 23/295* (2013.01); *H01L 23/3121* (2013.01); *H01L 23/49541* (2013.01); *H01L 2223/6677* (2013.01); *H01L 2224/04105* (2013.01); *H01L 2224/0557* (2013.01); *H01L 2224/06051* (2013.01); *H01L 2224/06187* (2013.01); *H01L 2224/12105* (2013.01); *H01L 2224/94* (2013.01); *H01L 2225/06513* (2013.01); *H01L 2924/12042* (2013.01); *H01L 2924/13055* (2013.01); *H01L 2924/13091* (2013.01); *H01L 2924/14* (2013.01)

(58) Field of Classification Search
CPC ............... H01L 21/56; H01L 23/49562; H01L 23/3178; H01L 23/49805; H01L 21/561
See application file for complete search history.

(56) References Cited

U.S. PATENT DOCUMENTS

| | | | | |
|---|---|---|---|---|
| 6,492,194 B1 * | 12/2002 | Bureau | ................... | H01L 21/56 257/E21.502 |
| 2004/0157410 A1 * | 8/2004 | Yamaguchi | ....... | H01L 23/49805 438/460 |
| 2005/0161785 A1 * | 7/2005 | Kawashima | ...... | H01L 23/49562 257/678 |
| 2007/0145539 A1 * | 6/2007 | Lam | ...................... | H01L 21/561 257/659 |
| 2010/0200959 A1 * | 8/2010 | Sasaki | ................. | H01L 23/3178 257/620 |

FOREIGN PATENT DOCUMENTS

KR      20080129051       *  6/2010  ............. H01L 23/12

* cited by examiner

*Primary Examiner* — Marc Armand
(74) *Attorney, Agent, or Firm* — Murphy, Bilak & Homiller, PLLC

(57) ABSTRACT

A semiconductor device includes a semiconductor chip having a first main surface, a second main surface opposite to the first main surface, and a side wall surface. An electrical contact area is exposed at the side wall surface of the semiconductor chip. An electrically conducting layer covers at least partially the second main surface and the electrical contact area.

15 Claims, 6 Drawing Sheets

SEMICONDUCTOR CHIP WITH ELECTRICALLY CONDUCTING LAYER

TECHNICAL FIELD

This invention relates to the technique of shielding a semiconductor chip from or coupling a semiconductor chip to electromagnetic radiation, and in particular to the technique of reducing EMI (electromagnetic interference) or providing an antenna for a semiconductor chip.

BACKGROUND

Semiconductor device manufacturers are constantly striving to increase the performance of their products, while decreasing their cost of manufacture. A cost intensive area in the manufacture of semiconductor devices is packaging the semiconductor chip. Electrically conducting layers may be used in semiconductor devices as antenna structures or for EMI shielding. Semiconductor devices and methods of manufacturing the same at low expenses are highly desirable.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
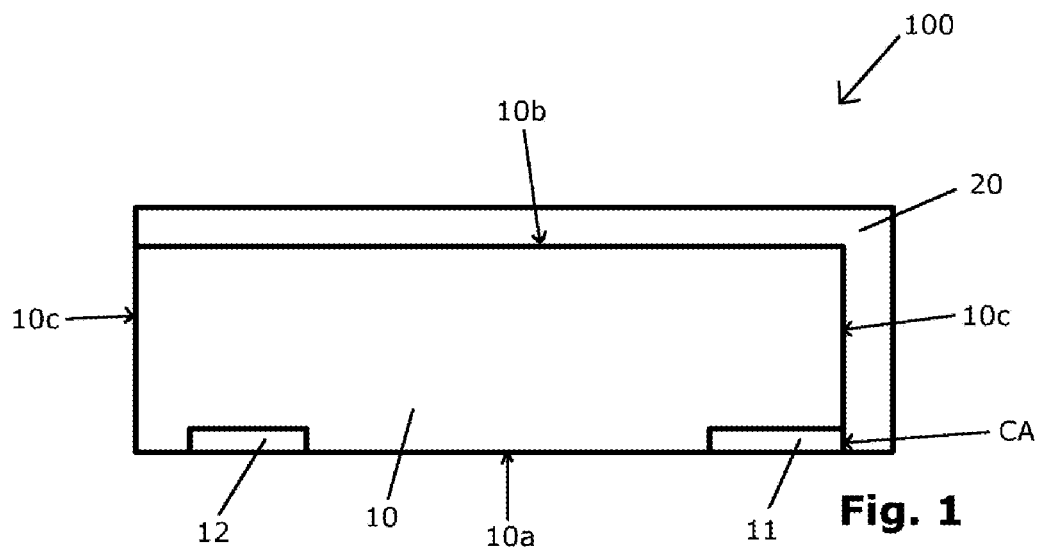
FIG. 1 schematically illustrates a cross-sectional view of an exemplary semiconductor device comprising a semiconductor chip provided with an electrically conducting layer and a chip electrode having a side face contacting to the electrically conducting layer.

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

The semiconductor devices described herein may contain one or more semiconductor chips. The semiconductor chip(s) described further below may be of different types, may be manufactured by different technologies and may include, for example, integrated circuits, e.g., monolithic integrated electrical, electro-optical or electro-mechanical circuits and/or passives. More specifically, the semiconductor chip(s) may include logic integrated circuits, analogue integrated circuits, mixed signal integrated circuits, power integrated circuits, memory circuits, or integrated passive devices (IPD).

The semiconductor chip(s) described herein may be manufactured from specific semiconductor material such as, for example, Si, SiC, SiGe, GaAs, GaN, AlGaN, InGaAs, InAlAs, etc., and, furthermore, may contain inorganic and/or organic materials that are not semiconductors.

The semiconductor chip(s) described herein may include control circuits, microprocessors, memory circuits and/or micro-electromechanical components. They may e.g. include sensors or detectors (such as, e.g., a mechanical force sensor, a pressure sensor, a microphone, an optical sensor/detector) and/or power devices (e.g. power switches, voltage converters, etc.). In particular, the semiconductor chip(s) described herein may comprise wireless communication components such as, e.g., RF (radio frequency), near field communication (NFC) circuitry and/or contactless or coreless coupling circuitry, etc.

Devices containing semiconductor chip(s) having a horizontal structure may be involved. A semiconductor chip having a horizontal structure has chip electrodes only on one of its two main surfaces, e.g. on its active surface.

Devices containing semiconductor chip(s) having a vertical structure may be involved. In a semiconductor chip having a vertical structure, the electric currents (e.g. the load current) can flow in a direction perpendicular to the main surfaces of the semiconductor chips. A semiconductor chip having a vertical structure has electrodes on its two main surfaces, that is to say on its top side and bottom side. In particular, power semiconductor chip(s) such as, e.g., power MOSFETs (Metal Oxide Semiconductor Field Effect Transistors), IGBTs (Insulated Gate Bipolar Transistors), JFETs (Junction Gate Field Effect Transistors), power bipolar transistors or power diodes may have a vertical structure. By way of example, the source electrode and gate electrode of a power chip, e.g. a power MOSFET chip, may be situated on one main surface, while the drain electrode of the power chip is arranged on the other main surface.

The semiconductor chip(s) may have chip electrodes (or contact pads) which allow electrical contact to be made with the integrated circuits included in the semiconductor chips. The chip electrodes, e.g. I/O electrodes, ground electrodes, power supply electrodes, load electrodes, control electrodes, etc., may include one or more metal layers that are applied to the semiconductor material. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium, or nickel vanadium, may be used as the material. The metal layers need not be homogenous or manufactured from just one material, that is to say various compositions and concentrations of the materials contained in the metal layers are possible.

At least one chip electrode may be arranged at a first main surface of the semiconductor chip. This chip electrode may be connected to an electrical contact area exposed at a side wall surface of the semiconductor chip.

In other embodiments, this chip electrode may be connected to an electrical contact area exposed at a second main surface of the semiconductor chip.

Further, the semiconductor chip may be at least partly covered by an electrically conducting layer. The electrically conducting layer may, e.g., be an electromagnetic interference shielding layer or an antenna layer. The electrically conducting layer may cover a part or all of a second main surface of the semiconductor chip and a part or all of the electrical contact area. That is, the electrically conducting layer may be electrically connected to the chip electrode via the electrical contact area, and the electrical connection may be established by depositing the electrically conducting layer over or directly onto the exposed electrical contact area.

The electrically conducting layer may be applied over the semiconductor chip by various techniques. By way of example, the electrically conducting layer may be deposited on the semiconductor chip by a CVD (chemical vapor deposition) process, a PVD (physical vapor deposition) process, spraying, printing, a plasma beam process, galvanic or electroless deposition, sputtering, or spin coating.

Further, the electrically conducting layer may be applied over the semiconductor chip by embedding the semiconductor chip into an electrically conducting encapsulating material by, e.g., molding or laminating. In the first case, if the electrically conducting layer is made of a mold material, various techniques such as, e.g., compression molding, injection molding, powder molding, or liquid molding may be used to form the electrically conducting layer. The mold material may be applied to overmold the semiconductor chip and a carrier on which the semiconductor chip is placed. In the second case, if the electrically conducting layer is made of a laminate material, the electrically conducting layer may have the shape of a piece of a layer, e.g. a piece of a sheet or foil that is laminated on the semiconductor chip and over a carrier on which the semiconductor chip is placed. The laminate material may e.g. be a compound material comprising a polymer foil and a metal foil.

The semiconductor device may further comprise an electrically insulating material forming an encapsulation body. The electrically insulating material may comprise or be made of a thermoset material or a thermoplastic material. A thermoset material may, e.g., be made on the basis of an epoxy resin, a silicone resin or an arylic resin. A thermoplastic material may, e.g., comprise one or more materials selected from the group of polyetherimide (PEI), polyethersulfone (PES), polyphenylene-sulfide (PPS), polyamide-imide (PAI), and polyethylene-terephthalate (PET). Thermoplastic materials melt by application of pressure and heat during molding or lamination and (reversibly) harden upon cooling and pressure release.

The electrically insulating material forming the encapsulation body may comprise or be made of a polymer material. The electrically insulating material may comprise at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

In various embodiments, the electrically insulating material may be a laminate, e.g. a polymer foil or sheet. Heat and pressure may be applied for a time suitable to attach the polymer foil or sheet to the underlying structure. During lamination, the electrically insulating foil or sheet is capable of flowing (i.e. is in a plastic state), resulting in that gaps between the semiconductor chips and/or other topological structures on the device carrier are filled with the polymer material of the electrically insulating foil or sheet. The electrically insulating foil or sheet may comprise or be made of any appropriate thermoplastic or thermoset material. In one embodiment, the insulating foil or sheet may comprise or be made of a prepreg (short for pre-impregnated fibers), that is e.g. made of a combination of a fiber mat, for example glass or carbon fibers, and a resin, for example a thermoset or thermoplastic material. Prepreg materials are known in the art and are typically used to manufacture PCBs (printed circuit boards).

In various embodiments, the electrically insulating material may be a mold material. The mold material may be applied by molding techniques such as, e.g., compression molding, injection molding, powder molding, or liquid molding.

FIG. 1 illustrates a cross-sectional view of an exemplary semiconductor device 100. The semiconductor device 100 comprises a semiconductor chip 10 having a first (bottom) main surface 10a, a second (top) main surface 10b and a side wall surface 10c. The semiconductor chip 10 may, e.g., include a monolithic integrated circuit (IC) and/or other components as mentioned above.

A first chip electrode 11 and, e.g., a second chip electrode 12 may be arranged on the first main surface 10a of the semiconductor chip 10. The first and second chip electrodes 11, 12 may provide electrical contact to an integrated circuit (not shown) formed in the semiconductor chip 10. Further, an electrically conducting layer 20 covers partially or completely the second main surface 10b of the semiconductor chip 10. Further, the electrically conducting layer 20 may cover partially or completely the side wall surface 10c of the semiconductor chip 10. The electrically conducting layer 20 may, e.g., serve as an EMI shielding layer or as an antenna for receiving or transmitting electromagnetic radiation.

The electrically conducting layer 20 may be electrically connected to the first chip electrode 11. More specifically, an electrical contact area CA is exposed at the side wall surface 10c of the semiconductor chip 10. The electrical contact area CA may directly connect to the electrical contact layer 20. The electrical contact area CA may be electrically connected to the first chip electrode. Further, the electrical contact area CA may be electrically connected to an integrated circuitry of the semiconductor chip 10.

By way of example, as illustrated in FIG. 1, the electrical contact area CA may be a side face of the first chip electrode 11. In this case, the first chip electrode 11 reaches up to the outline of the semiconductor chip 10 and forms an edge portion thereof.

Generally, the contact area CA may extend over only apart of the overall circumference of the semiconductor chip 10. More specifically, the extension of the electrical contact area CA along the circumferential outline of the semiconductor chip 10 may be smaller than 0.25, 0.2, 0.1, 0.05 times the circumference (perimeter) of the semiconductor chip 10. Further, the height of the electrical contact area CA measured in the direction of the thickness of the semiconductor chip 10 may be smaller than 0.8, 0.5, 0.3, 0.2, 0.1 times the thickness of the semiconductor chip 10.

In particular, if the electrical contact area CA may be formed by aside face of the first chip electrode 11 as exemplified in FIG. 1, the height of the electrical contact area CA may be identical to the thickness of the first chip electrode 11. Further, the length of the electrical contact area CA in a circumferential direction of the semiconductor chip 10 may be identical to the corresponding extension of the first chip electrode 11.

It is to be noted that the first chip electrode 11 may be a ground electrode. In particular, the first chip electrode 11 may be a ground electrode if the electrically conducting layer 20 is used as an EMI shielding layer. Further, the first chip electrode 11 may be an I/O electrode used as an input or output of an antenna signal received or transmitted via the electrically conducting layer 20. In this case, the electrically conducting layer 20 may be used as an antenna.

The semiconductor 10 may have a thickness (measured between the first main surface 10a and the second main surface 10b) of greater than or less than 700 µm, 600 µm, 500 µm, 400 µm, 300 µm, 200 µm, 100 µm, or 50 µm. In particular, the thickness of the semiconductor chip 10 may be in a range between 200 µm and 400 µm. The first and/or second main surface 10a, 10b of the semiconductor chip 10 may have an area greater than or less than 10 mm$^2$, 20 mm$^2$, 50 mm$^2$, 100 mm$^2$, 200 mm$^2$, 500 mm$^2$, 1000 mm$^2$, 2000 mm$^2$, 3000 mm$^2$, or 4000 mm$^2$. The electrically conducting layer 20 may have a thickness of greater than or less than 2 µm, 5 µm, 10 µm, 20 µm, or 40 µm. The thickness of the electrically conducting layer 20 may, e.g., be constant over its entire extension or may be constant over the second main surface 10b and/or the side wall surface 10c.

In all implementations, the electrically conducting layer 20 may be separated from the "bare" semiconductor chip 10 by an insulating layer (not shown) extending beneath the electrically conducting layer 20. In this case, the electrically conducting layer 20 may be applied directly onto an outside surface of the insulating layer. The insulating layer, if present, may have an opening to expose the electrical contact area CA. That is, for the sake of simplicity, the second main surface 10b and the side wall surface 10c of the semiconductor chip may either be understood as bare chip surfaces or as outside surfaces of the insulating layer coating the semiconductor chip 10. In the latter case, the term semiconductor chip 10 refers to the "passivated" semiconductor chip, i.e. to the bare semiconductor chip coated by the insulating layer. The insulating layer (not shown) may be an organic or inorganic layer having a thickness in the range between, e.g., 1 µm to 20 µm.

Figure 2:
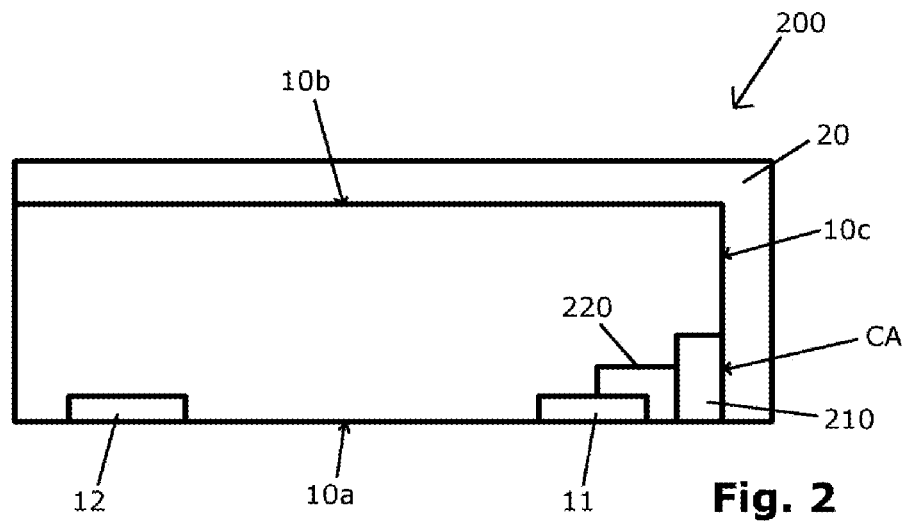
FIG. 2 schematically illustrates a cross-sectional view of an exemplary semiconductor device comprising a semiconductor chip provided with an electrically conducting layer and a chip electrode electrically connected to a chip side wall contact area which contacts to the electrically conducting layer.

FIG. 2 illustrates a cross-sectional view of an exemplary semiconductor device 200. The semiconductor device 200 may be identical to semiconductor device 100 except that the electrical contact area CA exposed at the side wall surface 10c of the semiconductor chip 10 is formed by a side face of a metal block 210 rather than by a side face of the first chip electrode 11. More specifically, the first chip electrode 11 may be electrically connected via a chip-internal wiring 220 to the metal block 210. The metal block 210 may be made of any metal or metal alloy used in semiconductor processing, for example, aluminum, titanium, gold, silver, copper, palladium, platinum, nickel, chromium, or nickel-vanadium.

In semiconductor device 200 the dimensions (circumferential length, height) of the exposed electrical contact area CA may be chosen independently of the dimensions of the first chip electrode 11. That is, by way of example, the metal block 210 may be greater in height than the thickness of the first chip electrode 11. Further, it is possible that the circumferential length of the electrical contact area CA is greater or smaller than the corresponding circumferential dimension of the first chip electrode 11. Except of these differences the description of semiconductor device 100 also applies to semiconductor device 200, and reiteration is avoided for the sake of brevity. In particular, the dimensional quantities set out above for semiconductor device 100 also apply for semiconductor device 200.

Figure 3:
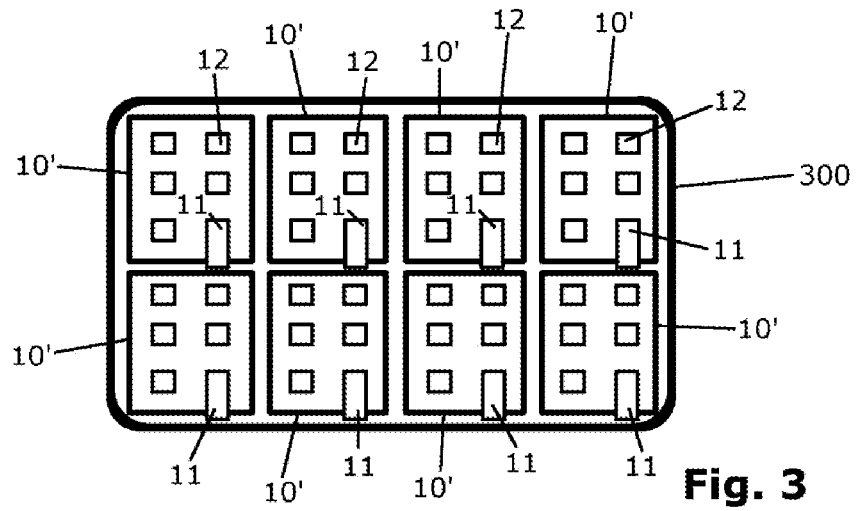
FIG. 3 schematically illustrates a plan view of a wafer, thereby showing the outlines of semiconductor chips and chip electrodes prior to separation.

FIG. 3 illustrates a plan view of a section of a wafer 300. The wafer 300 has been processed to include an array of semiconductor chips 10. The semiconductor chips 10 are not yet separated from each other so that FIG. 3 merely displays chip zone boundaries 10' on the wafer 300 rather than separated chips 10.

The chips 10 are separated by dicing the wafer 300 along dicing streets running in the spacings between the semiconductor chip zones boundaries 10'. Dicing streets are also referred to as kerf regions in the art. As may be seen in FIG. 3, the first chip electrodes 11 may be designed to extend beyond the chip zone boundary 10' to reach into the kerf regions. The other electrodes, e.g. the second chip electrode 12, may be designed to remain completely within the chip zone boundary 10', i.e. not to reach into the kerf regions.

Figure 4:
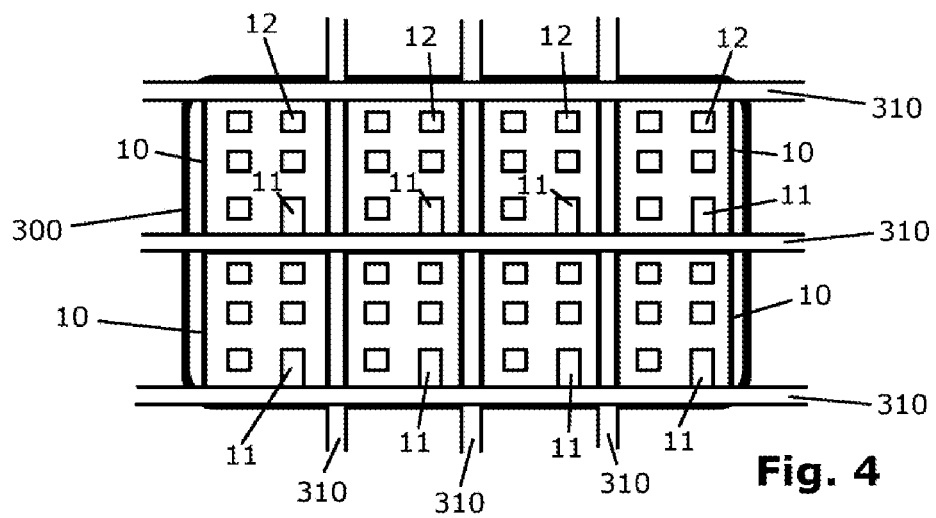
FIG. 4 schematically illustrates a plan view of a wafer, thereby showing the outlines of semiconductor chips and chip electrodes after separation.

FIG. 4 illustrates by way of example a plan view of the section of the semiconductor wafer 300 after wafer dicing. Thus, FIG. 4 displays the separated semiconductor chips 10 as arranged, e.g., on a dicing tape (not shown). The dicing streets (kerf regions) 310 define the outline or side wall surfaces 10c of the semiconductor chips 10 (if not "passivated" thereafter). That is, the outlines of the semiconductor chips 10 may correspond to the chip zone boundaries 10' as illustrated in FIG. 3. By dicing the semiconductor wafer 300 along the dicing streets 310, the projecting portions of the first chip electrodes 11, as illustrated in FIG. 3, are removed, e.g. cut away. That way, the first chip electrodes 11 become exposed at the side wall surfaces 10c of the semiconductor chips 10.

The width of each dicing street (kerf region) may depend on the dicing technique and equipment used. Dividing the wafer 300 into single semiconductor chips 10 may be performed by any suitable technique, e.g. by blade dividing (mechanical sawing), laser dicing, etching, cutting, scribing, braking, etc. In particular, stealth dicing, which is a specific technique using laser dicing, may e.g. be applied. Depending on the technique used, the width of the dicing streets 310 may be in a range between 20 μm to 150 μm, in particular between 60 μm to 100 μm.

Figure 5:
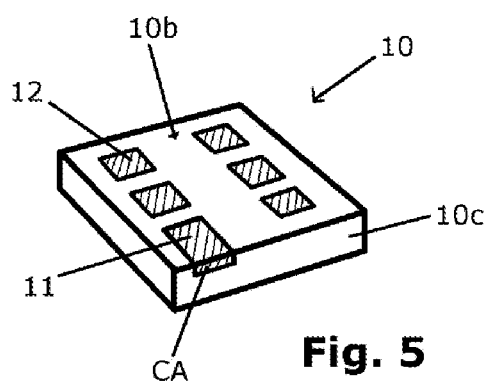
FIG. 5 schematically illustrates a perspective view of a semiconductor chip provided with a chip electrode having a side face exposed at a side wall of the semiconductor chip.

FIG. 5 schematically illustrates a perspective view of a semiconductor chip 10 provided with a first chip electrode 11 having a side face exposed at the side wall 10c of the semiconductor chip 10. The exposed side face of the first chip electrode 11 constitutes the electrical contact area CA. The semiconductor chip 10, as shown in FIG. 5, may be manufactured in accordance with the processes described in conjunction with FIGS. 3 and 4. Further, the semiconductor chip 10 of FIG. 5 may be identical to the semiconductor chip 10 of FIG. 1.

Although FIGS. 3-5 illustrate, by way of example, a semiconductor chip 10 containing e.g. six chip electrodes (including first chip electrode 11 and second chip electrode 12), it is to be noted that the semiconductor chip 10 may have a higher number of chip electrodes. By way of example, in particular if the semiconductor chip 10 is a logic chip, the number of chip electrodes may be equal to or higher than 10, 20, 40, 60, or 80. In some embodiments only one of these electrodes, namely the first chip electrode 11, provides for an exposed electrical contact area CA at the side wall surface 10c of the semiconductor chip 10. In other embodiments a plurality of first chip electrodes 11, each providing for an exposed electrical contact area CA, may be provided. In this case, the plurality of first chip electrodes 11 may be distributed over one or a plurality of side faces of the semiconductor chip 10.

Figure 6:
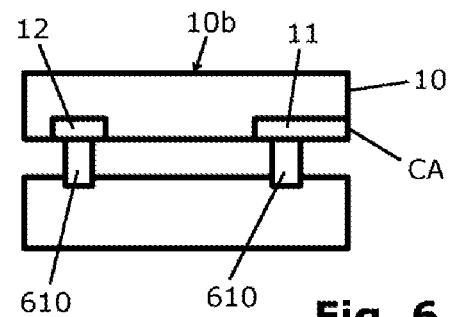
FIG. 6 schematically illustrates a cross-sectional view of the semiconductor chip as shown in FIG. 5.

FIG. 6 schematically illustrates a cross-sectional view of the semiconductor chip 10 of FIG. 5. Connecting elements 610 such as, e.g., solder deposits or pillars may be connected to the first and second chip electrodes 11, 12. The connecting elements 610 are optional. As will be explained further below in more detail, the connecting elements 610 may represent external terminals of a semiconductor device or internal conductors of a semiconductor device which packages the semiconductor chip 10.

Figure 7A:
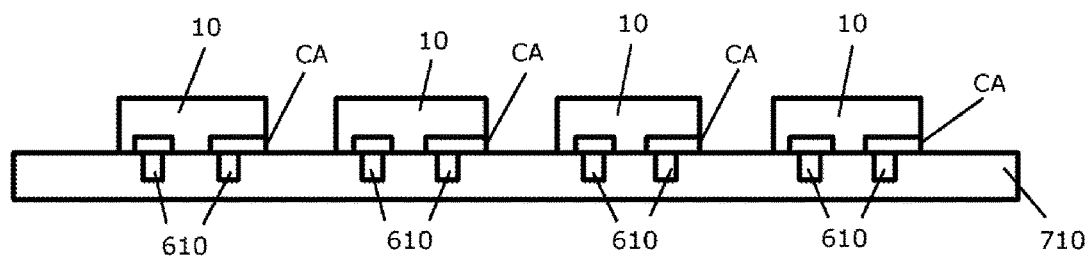
FIGS. 7A-7C schematically illustrate cross-sectional views of an exemplary process of a method of manufacturing an exemplary semiconductor device comprising a packaged semiconductor chip equipped with an electrically conducting layer.
Figure 7B:
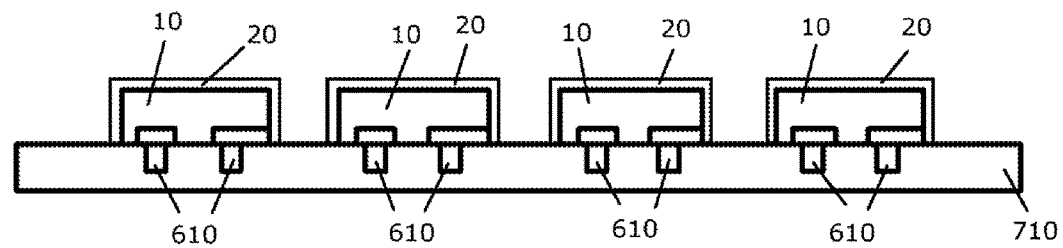
Figure 7C:
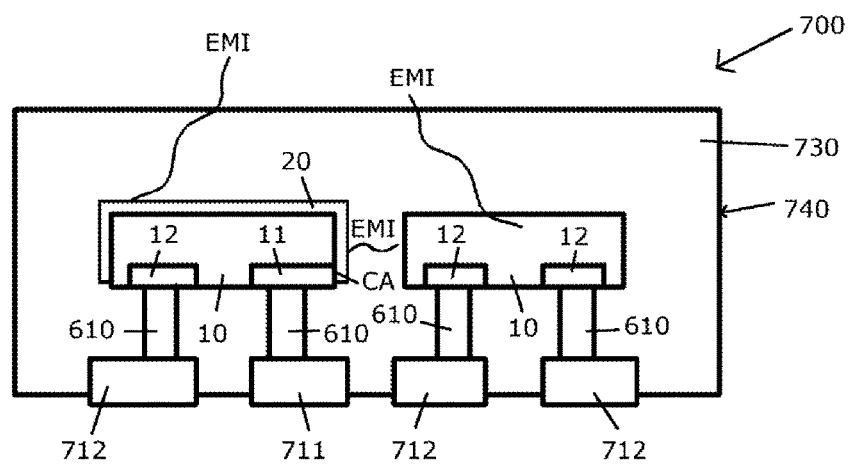

FIGS. 7A-7C illustrate cross sectional views of stages of an exemplary process of manufacturing a semiconductor device 700. Referring to FIG. 7A, semiconductor chips 10 as, e.g., illustrated in FIG. 6 are placed on a temporary carrier 710. The temporary carrier 710 may have an adhesive surface to hold the semiconductor chips 10 in place. The temporary carrier 710 may, e.g., be a sticky tape. In particular, the temporary carrier 710 may have a soft surface allowing to press the (optional) connecting elements 610 into the temporary carrier 710. When placed onto the temporary carrier 710, the electrical contact areas CA at the side wall surfaces 10c of the semiconductor chips 10 may be exposed.

Referring to FIG. 7B, the electrically conducting layer 20 is applied over the semiconductor chips 10 and, in particular, over the electrical contact areas CA exposed at the side wall surfaces 10c of the semiconductor chips 10. That way, the electrical contact area(s) CA of each semiconductor chip 10 is (are) electrically connected to the electrically conducting layer 20. As shown in FIG. 7B, the entire side wall surface 10c and the entire second main surface 10b may be covered by the electrically conducting layer 20. Alternatively, the electrically conducting layer 20 may be structured to cover only one or more (partial) portions of the side wall surface 10c and/or one or more (partial) portions of the second main surface 10b. FIG. 7B illustrates, by way of example, a method in which a plurality of semiconductor chips 10 are provided substantially in parallel with the electrically conducting layer 20.

The electrically conducting layer 20 may, e.g., be formed by spraying, sputtering, printing, dispensing or spin-coating a conducting polymer, e.g. conducting ink on the second main surfaces 10b (backsides) of the semiconductor chips 10. Further, processes to apply the electrically conducting layer 20 may comprise CVD processes, PVD processes, plasma beam deposition processes, galvanic or electroless deposition of metal, sputtering of metal, etc. Depending on the process used, the conducting layer 20 may either be applied only to the semiconductor chip 10 surfaces (as exemplified in FIG. 7B), or, additionally, to the exposed regions of the surface of the temporary carrier 710.

By way of example, if a plasma beam deposition process is used, a plasma beam generator (not shown) may be moved over the semiconductor chips 10 and the temporary carrier 710. The plasma beam generator may discharge a plasma beam which is directed to one or more semiconductor chips 10 and the free spaces between the semiconductor chips 10. In order to achieve a desired thickness of the electrically conducting layer 20 over the semiconductor chips 10, the plasma beam generator may perform several sweeping movements in a transversal direction. Plasma beam deposition methods as well as the other methods mentioned above may provide for low process temperatures, e.g. equal to or less than 250° C. or 220° C., and for a thickness of the electrically conducting layer 20 in accordance with the above disclosure.

After application of the electrically conducting layer 20, the electrically conducting layer 20 may optionally be cured (e.g. if the layer is made of a conducting polymer material such as, e.g., an ink).

The semiconductor chips 10 coated with the electrically conducting layer 20 may then be removed from the temporary carrier 710. They may then be used as semiconductor devices (e.g. as so-called "bare chip packages") to be mounted on application boards or they may be packaged further as, e.g., described below.

FIG. 7C illustrates an exemplary semiconductor device 700. The semiconductor device 700 may comprise a plurality of semiconductor chips 10. At least one of the semiconductor chips 10 is equipped with the electrically conducting layer 20 as described above. In semiconductor device 700 the semiconductor chips 10 may be embedded in an electrically insulating material 730 forming an encapsulation body 740. Embedding the semiconductor chips 10 in the insulating material 730 may be performed by using a molding process (in that case, the insulating material 730 is a molding material such as, e.g., a resin) or a lamination process (in this case, the insulating material 730 may be a foil material pressed onto and between the semiconductor chips 10). As apparent in FIG. 7C the connecting elements 610 may be used as internal conductors which electrically connect the first and/or second chip electrodes 11, 12 to external terminals 711 and 712, respectively, of the semiconductor device 700.

The semiconductor chip 10 equipped with the electrical conducting layer 20 may be shielded against EMI. In this case, the external terminal 711 may be the ground terminal of the semiconductor device 700. EMI may be caused by external sources or by internal components of the semiconductor device 700. In particular, an individual shielding of a specific semiconductor chip 10 contained in the semiconductor device 700 may be obtained and may, by way of example, be beneficial if the semiconductor device 700 itself contains RF or NFC components. Further, the electrical conducting layer 20 may be configured as an antenna. E.g. in this and other cases, the external terminal 711 may, for instance, be omitted, the first chip electrode 11 may be an antenna TX and/or RX electrode and the semiconductor chip 10 may, e.g., contain a RF, NFC and/or contactless or coreless coupling circuitry.

It is to be noted that the semiconductor device 700 may also be a single chip device. That is, by way of example, only the semiconductor chip 10 equipped with the electrically conducting layer 20 shown in the left part of FIG. 7C may be contained in the semiconductor device 700.

The semiconductor device 700 may be fabricated by an eWLP (embedded Wafer Level Packaging) process. In this case, semiconductor chips 10 are placed in a spaced-apart relationship on a temporary packaging carrier (not shown) supporting the external terminals 711, 712. The insulating material 730 is then applied over the temporary packaging carrier and the semiconductor chips 10 placed thereon to form a so-called artificial wafer. The artificial wafer may include a high number of semiconductor devices 700. The artificial wafer is then divided into the single semiconductor devices 700 each being packaged by an encapsulation body 740.

It is to be noted that the process illustrated by way of example by FIGS. 7A-7C may also be performed using the semiconductor devices 200 or other semiconductor devices described herein.

Figure 8A:
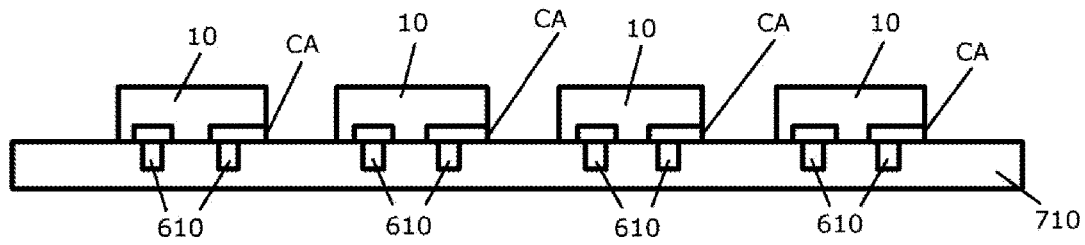
FIGS. 8A-8D schematically illustrate cross-sectional views of an exemplary process of a method of manufacturing an exemplary semiconductor device comprising a packaged semiconductor chip equipped with an electrically conducting layer.

FIGS. 8A-8D illustrate cross-sectional views of a process to manufacture a semiconductor device 800. FIG. 8A illustrates the placement of a plurality of semiconductor chips 10 in a spaced-apart relationship on temporary carrier 710 as already explained in conjunction with FIG. 7A, to which reference is made.

Figure 8B:
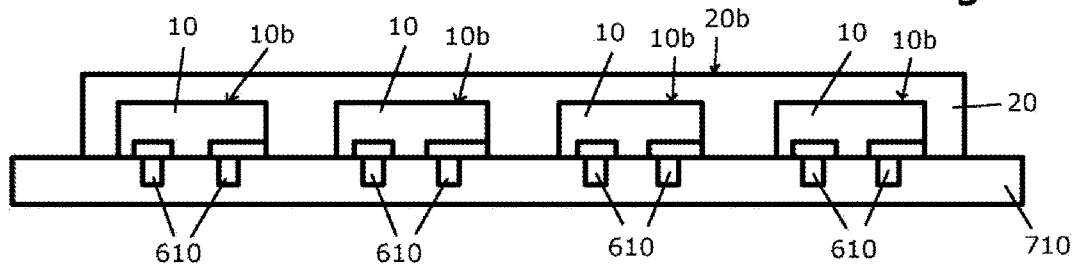

FIG. 8B illustrates the application of an electrically conducting layer 20 over the second main surfaces 10b of the semiconductor chips 10 and the electrical contact areas CA at the side wall surfaces 10c of the semiconductor chips 10. The electrically conducting layer 20 electrically connects to the exposed electrical contact areas CA. The electrically conducting layer 20 may partly or completely cover the second main surfaces 10b. The electrically conducting layer 20 may partly or completely cover the side wall surfaces 10c of the semiconductor chips 10. The electrically conducting layer 20 may also be applied over regions of the temporary carrier 710 which are not covered by the semiconductor chips 10. More specifically, the electrically conducting layer 20 may partly or completely fill the spacings between adjacent semiconductor chips 10.

The electrically conducting layer 20 may provide for a plate-shaped or disc-shaped body which may completely embed the semiconductor chips 10 except of their first main surfaces 10a. The first main surfaces 10a may remain exposed because they are covered by the temporary carrier 710. Further, the connecting elements 610 (e.g. solder deposits, pillars, etc.), if present, may remain exposed from the electrically conducting layer 20.

The application of the electrically conducting layer 20 as illustrated in FIG. 8B may, e.g., be performed by using a molding technique or a lamination technique. More specifically, if using a molding technique, the arrangement shown in FIG. 8A may be placed into a mold tool having an upper mold half and a lower mold half. Liquid molding material is introduced into a cavity defined by the lower mold half and the upper mold half. This process may be accompanied by the application of energy (e.g. heat, radiation, etc.) and pressure. After curing, the molding material is rigid and forms the electrically conducting layer 20. The molding material may be an epoxy-based material or another appropriate material. It may also be a photoresist such as, e.g., SU8, which is epoxy-based.

The molding material to form the electrically conducting layer 20 is electrically conducting. By way of example, it may comprise electrically conducting filler particles. The electrically conducting filler particles may have a mean diameter of less than or greater than 30 μm, 40 μm, or 70 μm. The thickness of the electrically conducting layer 20 as measured between the second main surface 10b of the semiconductor chips and the upper surface 20b of the electrically conducting layer 20 may be less than or greater than 200 μm, 300 μm, or 400 μm. It is to be noted that the upper surface 20b of the electrically conducting layer 20 may, e.g., be substantially planar.

If using a laminating technique to form the electrically conducing layer 20 as shown in FIG. 8B, one or more adhesive foils may be laminated over the temporary carrier 710 and the semiconductor chips 10 placed thereon. Also in this case, the semiconductor chips 10 may be completely covered by the foil material(s). By way of example, the foil may be a composite or multi-layer foil comprising of at least one layer of organic material and one layer of an electrically conducting material. The layer of organic material may be made of one or more of e.g. epoxy, acrylate or polyimide. Specific examples of materials which may be used for the organic material are PEEK (polyetheretherketone), PPS (polyphenylene sulfide), PSU (polysulfone), PEI (polyetherimide), PAI (polyamidimide), and LCP (liquid crystalline polymers). The electrically conducting layer material may be a metal.

If a composite or multi-layer foil is used, the electrical conductivity of the electrically conducting layer 20 is provided by the electrically conducting layer of the composite foil. In this case, the electrically conducting layer has to be contacted to the electrical contact areas CA at the side wall surfaces 10c of the semiconductor chips 10. In other embodiments, the foil to be laminated over the arrangement shown in FIG. 8A may have inherently electrically conducting. Electrical conductivity may be caused by electrically conducting filler particles contained in the foil to be laminated. By way of example, filler particles such as described above in conjunction with the molding process may be embedded in the foil.

The foil may be laminated to the arrangement shown in FIG. 8A by the application of energy (e.g. heat, radiation) and/or pressure. Thereafter, the foil may e.g. be hardened to provide for the electrically conducting layer 20 as shown in FIG. 8B. The electrically conducting layer 20 may have a substantially planar upper surface 20b.

Figure 8C:
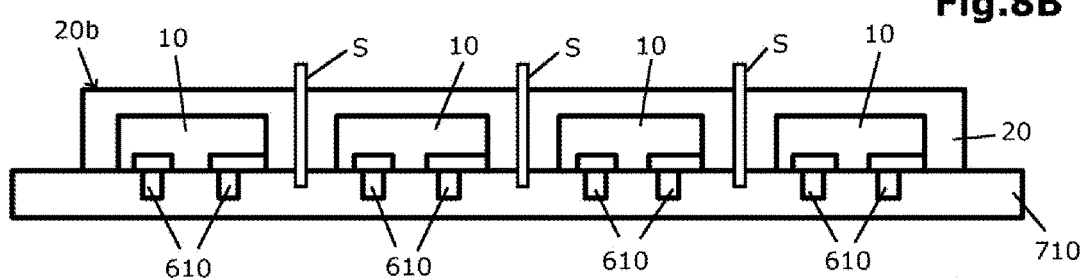

Referring to FIG. 8C, the semiconductor chips 10 as pre-encapsulated in the electrically conducting layer 20 may than be separated. Separation may be performed by, e.g., mechanical sawing, cutting, etching, laser dicing, scribing, braking, etc., along separation lines S shown in FIG. 8C. It is to be noted that one or a plurality of semiconductor chips 10 may be contained in a separated entity.

Figure 8D:
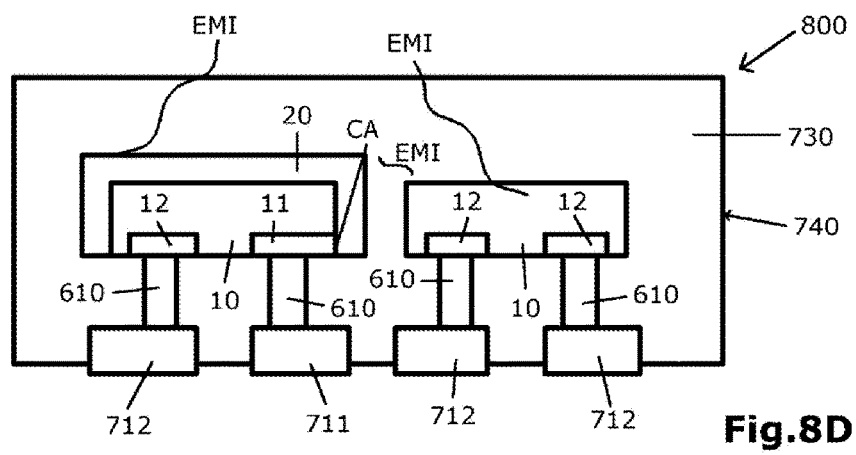

After separation, the semiconductor chips 10 pre-encapsulated within the electrically conducting layer 20 are removed from the temporary carrier 710. Then, as exemplified in FIG. 8D, these entities may be used to establish the semiconductor device 800. Semiconductor device 800 is similar to semiconductor device 700 (except that the electrically conducting layer 20 is created by e.g. molding or lamination), and reference is made to the disclosure to FIG. 7C in order to avoid reiteration. One or more of the pre-encapsulated semiconductor chips 10 may be contained in the semiconductor device 800. Further, as shown in FIG. 8D, one or more semiconductor chips 10 which are not provided with an electrically conducting layer 20 may be contained in the semiconductor device 800.

Figure 9A:
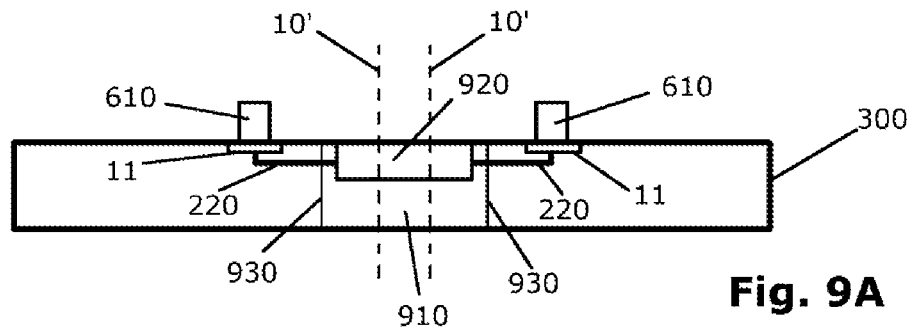
FIGS. 9A-9B schematically illustrate cross-sectional views of an exemplary process of a method of manufacturing an exemplary semiconductor device comprising a semiconductor chip provided with an electrical contact area exposed at a side wall surface thereof.
Figure 9B:
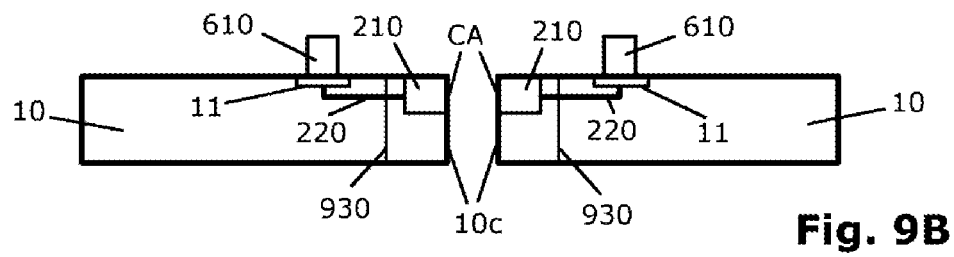

FIGS. 9A-9B illustrate cross sectional views of process stages of a method to produce semiconductor chips 10 provided with an electrical contact area CA exposed at a side wall surface thereof. Byway of example, a semiconductor chip 10 as illustrated in FIG. 2 may be obtained by this process. FIG. 9A illustrates a portion of a semiconductor wafer 300 containing two chip zones boundaries 10'. A metal part 920 may be arranged in the wafer 300 to intersect the two chip zone boundaries 10' and to reach with both ends into chip edge regions 930. The metal part 920 is connected by the chip-internal wirings 220 to the first chip electrodes 11 of both semiconductor chips zones. Optionally, connecting elements 610 may be placed on the first chip electrodes 11 (and also on the second chip electrodes 12 not depicted in FIG. 9A) on wafer level.

Referring to FIG. 9B, the semiconductor chips 10 are separated by dividing the wafer 300 into single chips 10. The dicing streets between the two chip zone boundaries 10' may run through the metal parts 920 to divide the metal parts 910 into the metal blocks 210. That way, electrical contact areas CA exposed at the side wall surfaces 10c of the semiconductor chips 10 are produced from the metal part 920 by wafer level processes as shown in FIGS. 9A-9B.

The semiconductor chips 10 shown in FIG. 9B may then be covered by the electrically conducting layer 20, see e.g. FIG. 2. Any of the techniques described above for applying the electrically conducting layer 20 may be used.

FIGS. 10A-10D illustrate cross sectional views of an exemplary process to manufacture semiconductor devices 1000. According to FIG. 10A, a semiconductor wafer 300 is provided. Dashed lines indicate the outlines of planned dicing streets 310 and may correspond to chip zone boundaries 10'.

Figure 10A:
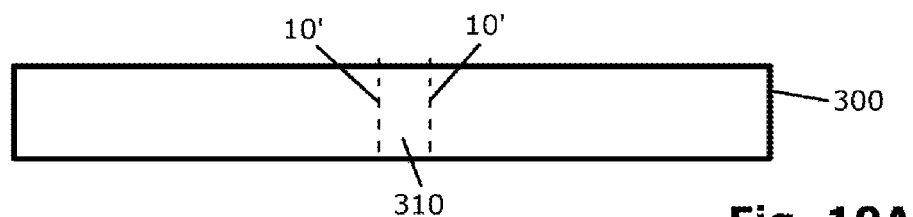
FIGS. 10A-10D schematically illustrate cross-sectional views of an exemplary process of a method of manufacturing an exemplary semiconductor device comprising a semiconductor chip provided with an electrically conducting layer connected to a chip electrode.
Figure 10B:
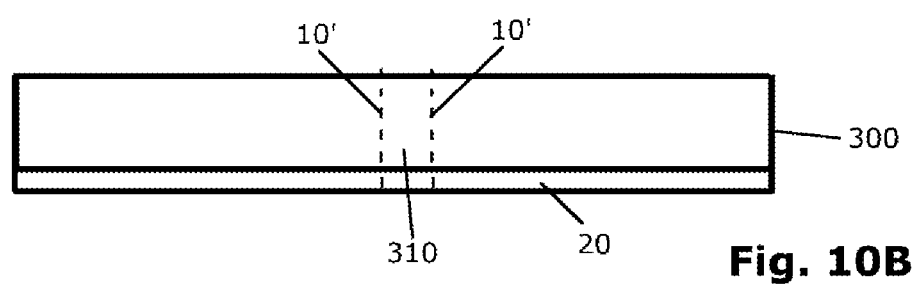

According to FIG. 10B, the electrically conducting layer 20 is applied over a surface of the semiconductor wafer 300 which corresponds to the second main surface 10b of the chips 10 when separated from the semiconductor wafer 300. It is to be noted that in this case the electrically conducting layer 20 may be formed on wafer level, i.e. at a stage of the manufacturing process in which the semiconductor chips 10 are not yet separated from the wafer 300. The electrically conducting layer 20 may be applied to the wafer 300 by any of the techniques described above.

Figure 10C:
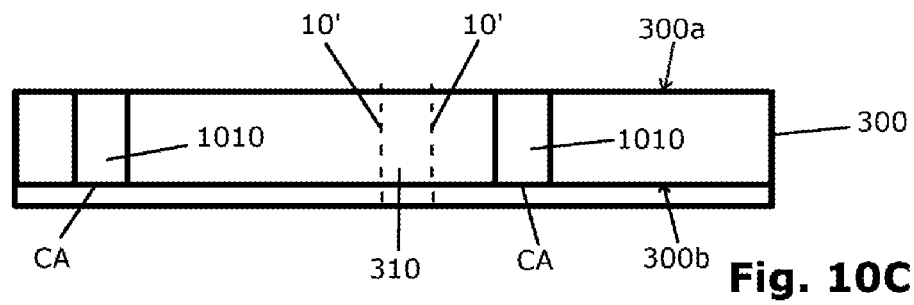

Referring to FIG. 10C, internal electrically conducting through-connections 1010 may be formed in the semiconductor wafer 300. The electrically conducting through-connections 1010 may extend from a first main surface 300a to a second main surface 300b of the semiconductor wafer 300. By way of example, the electrically conducting through-connections 1010 may be TSVs (Through Silicon Vias).

The electrically conducting through-connections 1010 may be manufactured at wafer level. The electrically conducting through-connections 1010 may provide for electrical contract areas CA which are exposed at the second main surface 300b of the semiconductor wafer 300. The electrical contact areas CA may directly contact the electrically conducting layer 20.

It is also possible that the electrically conducting through-connections 1010 are fabricated before the electrically conducting layer 20 is applied to the second main surface 300b of the wafer 300. In this case, the electrically conducting layer 20 may be directly deposited onto the electrical contact areas CA of the electrically conducting through connections 1010. Further, it is to be noted that the chip electrodes 11, 12 may be produced on wafer level before or after the electrically conducting through-connections 1010 are fabricated.

Figure 10D:
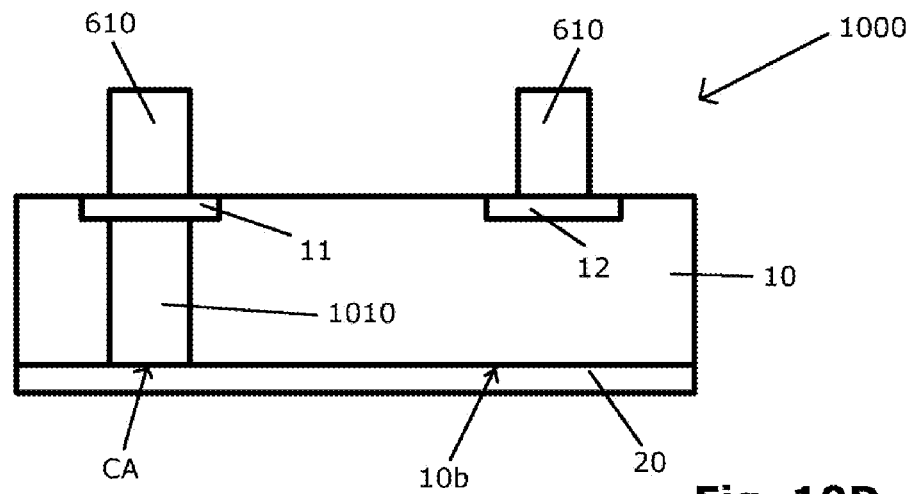

FIG. 10D illustrates the semiconductor device 1000. The electrically conducting through-connection 1010 electrically connects the electrically conducting layer 20 to the first chip electrode 11, which may be the ground chip electrode. The connecting element 610 may have been fabricated on wafer level or after semiconductor chip separation. Semiconductor chip separation is performed along dicing streets 310. Again as mentioned before, the second main surface 10b of the semiconductor chip 10 may be partly or completely covered by the electrically conducting layer 20. Further, as holds for all embodiments described therein, the second main surface 10b of the semiconductor chip 10 may be a passivated surface, that is an insulating layer (not shown) may extend between the bare chip surface and the electrically conducting layer 20 in order to electrically insulate the semiconductor chip 10 from the electrically conducting layer 20. The connecting elements 610 shown in FIG. 10D are optional and may be fabricated on wafer level or after chip separation.

Figure 11:
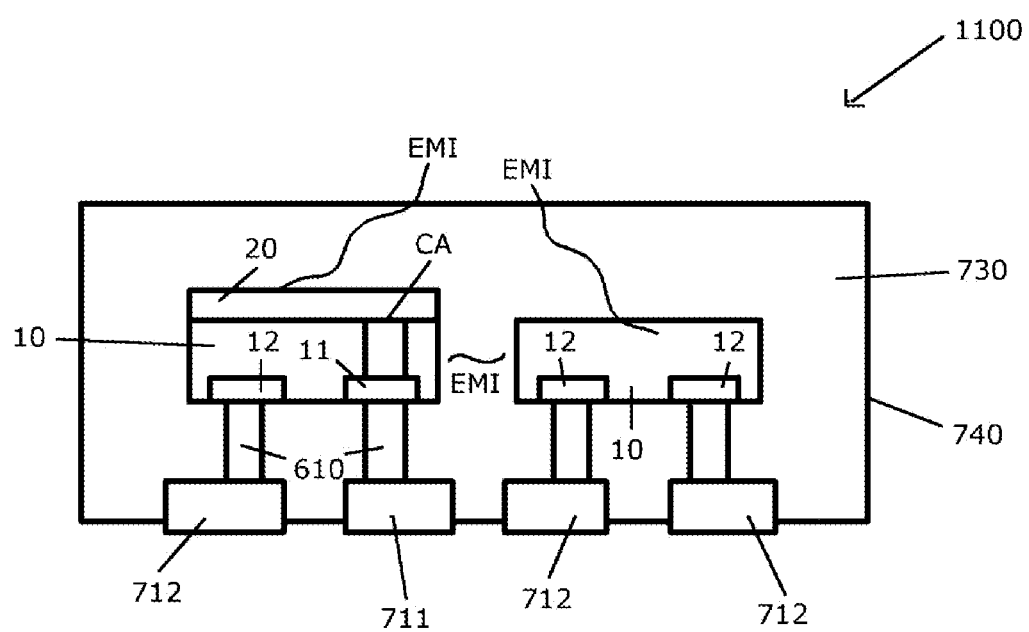
FIG. 11 schematically illustrates a cross-sectional view of an exemplary semiconductor device comprising a packaged semiconductor chip equipped with an electrically conducting layer.

FIG. 11 illustrates a semiconductor device 1100 comprising a packaged semiconductor chip 10 equipped with the electrically conducting layer 20. Semiconductor device 1100 may use the semiconductor device 1000 shown in FIG. 10D. Besides that, semiconductor device 1100 is similar to semiconductor devices 700 and 800, and reference is made to the corresponding description in order to avoid reiteration.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Byway of example, any types and number of semiconductor chips, RF or NFC components, antennas and/or EMI shieldings may be comprised in the embodiments. Therefore, it is intended that this invention be limited only by the claims and the equivalents thereof.

What is claimed is:

1. A semiconductor device, comprising:
a semiconductor chip having a first main surface, a second main surface opposite to the first main surface, and a side wall surface of a semiconductor material;
a chip electrode of a conducting electrode material arranged at the first main surface, the chip electrode having a shape of a layer extending parallel to the first main surface;
an electrical contact area of the conducting electrode material exposed at the side wall surface, wherein the electrical contact area is a side face of the chip electrode, wherein the electrical contact area is coplanar with the side wall surface of the semiconductor material; and
an electrically conducting layer covering at least partially the second main surface and the electrical contact area.

2. The semiconductor device of claim 1, wherein the electrically conducting layer is an electromagnetic interference shielding layer.

3. The semiconductor device of claim 1, wherein the electrically conducting layer is an antenna layer.

4. The semiconductor device of claim 1, wherein the electrically conducting layer directly connects to the electrical contact area.

5. The semiconductor device of claim 1 wherein the chip electrode is a ground electrode.

6. The semiconductor device of claim 1, further comprising:
a metal block, wherein the electrical contact area is a side face of the metal block; and
a chip-internal wiring line connecting the chip electrode to the metal block.

7. The semiconductor device of claim 1, wherein the electrically conducting layer comprises at least one of the group consisting of a metal layer, a conducting polymer material, a conducting ink, a conducting paint, a conducting molding material, and a conducting laminate material.

8. The semiconductor device of claim 1, wherein the first main surface is an active surface of the semiconductor chip and the second main surface is a non-active surface of the semiconductor chip.

9. The semiconductor device of claim 1, further comprising:
an electrically insulating encapsulation material covering at least partially the electrically conducting layer.

10. The semiconductor device of claim 1, wherein a height of the electrical contact area as measured in a direction of a thickness of the semiconductor chip is identical to a thickness of the layer.

11. The semiconductor device of claim 1, wherein a height of the electrical contact area as measured in a direction of a thickness of the semiconductor chip is smaller than 0.5 times a thickness of the semiconductor chip.

12. A method of manufacturing a semiconductor device, the method comprising:
providing a wafer;
processing the wafer to include a semiconductor chip within a chip zone boundary on the wafer;
applying a chip electrode of a conducting material on a first main surface of the wafer, the chip electrode has a shape of a layer extending parallel to the first main surface and is designed to extend beyond the chip zone boundary into a dicing street region on the wafer;
separating the semiconductor chip from the wafer by dicing along the dicing street region, wherein the dicing produces a side wall surface of a semiconductor material of the semiconductor chip and, by dicing through the chip electrode, an electrical contact area of the conducting electrode material exposed at the side wall surface, wherein the electrical contact area is a side face of the chip electrode; and
applying an electrically conducting layer over the electrical contact area exposed at the side wall surface and over a second main surface of the-semiconductor chip, wherein the chip electrode is arranged at a first main surface of the semiconductor chip.

13. The method of claim 12, further comprising:
forming the electrical contact area by separating the bare semiconductor chip from a wafer.

14. The method of claim 12, wherein the electrically conducting layer is applied by a CVD process, a PVD process, spraying, printing, a plasma beam deposition process, galvanic or electroless deposition, sputtering, or spin coating.

15. The method of claim 12, wherein the electrically conducting layer is applied by embedding the semiconductor chip into an electrically conducting encapsulating material by molding or by laminating.

* * * * *